(12) United States Patent
Arrigotti et al.

(10) Patent No.: US 6,764,325 B2
(45) Date of Patent: Jul. 20, 2004

(54) ZERO INSERTION FORCE HEAT-ACTIVATED RETENTION PIN

(75) Inventors: George Arrigotti, Portland, OR (US); Raiyomand Aspandiar, Portland, OR (US); Christopher D. Combs, Portland, OR (US); Tom E. Pearson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 10/152,144

(22) Filed: May 20, 2002

(65) Prior Publication Data

US 2003/0216066 A1 Nov. 20, 2003

(51) Int. Cl.⁷ .............................................. H01R 13/62
(52) U.S. Cl. ...................................... 439/161; 361/773
(58) Field of Search ........................ 439/161, 78–83, 439/65, 52, 560, 571; 361/760, 772–773

(56) References Cited

U.S. PATENT DOCUMENTS

| 4,487,465 A | * 12/1984 | Cherian ...................... 439/161 |
| 4,505,532 A | * 3/1985 | Hine et al. .................. 439/296 |
| 6,617,522 B2 | * 9/2003 | Tabacutu ..................... 174/260 |

* cited by examiner

*Primary Examiner*—J. F. Duverne
(74) *Attorney, Agent, or Firm*—Schwabe, Williamson & Wyatt, P.C.

(57) ABSTRACT

The present invention relates to apparatus and methods for minimizing open electrical connections between carrier substrates and components connected thereto that occur due to sag in the substrate incurred due to exposure to an increasing heat profile encountered to secure the component to the substrate. A zero insertion force heat activated retention pin expands or bends during the temperature increase, creating an upward force on the printed circuit board. This upward force counters the downward sag forces and enables the carrier substrate to maintain a coplanar relationship with the component being connected.

29 Claims, 3 Drawing Sheets

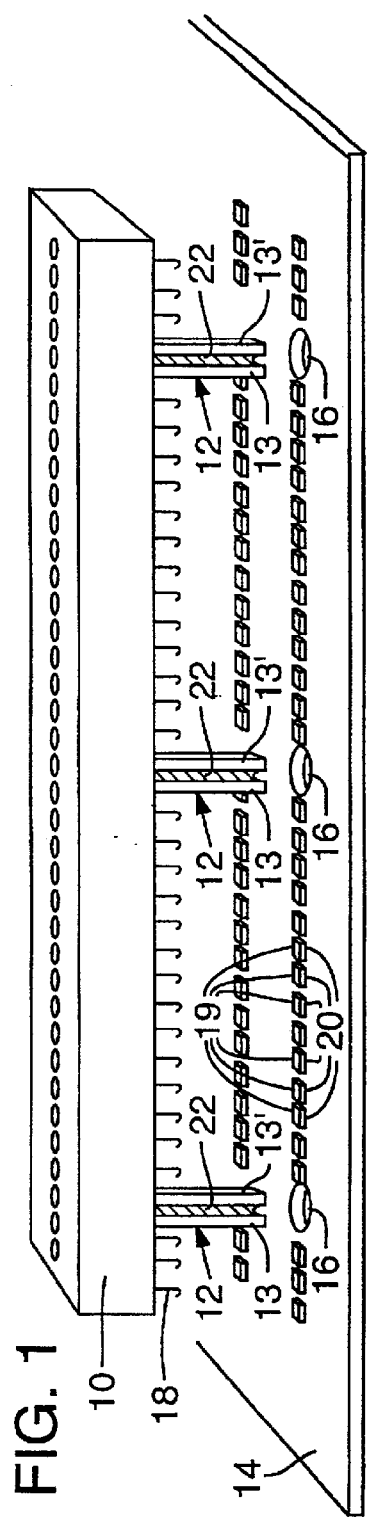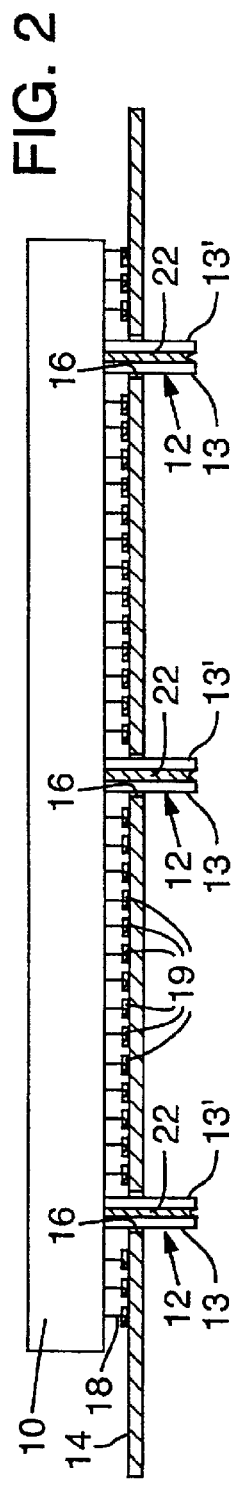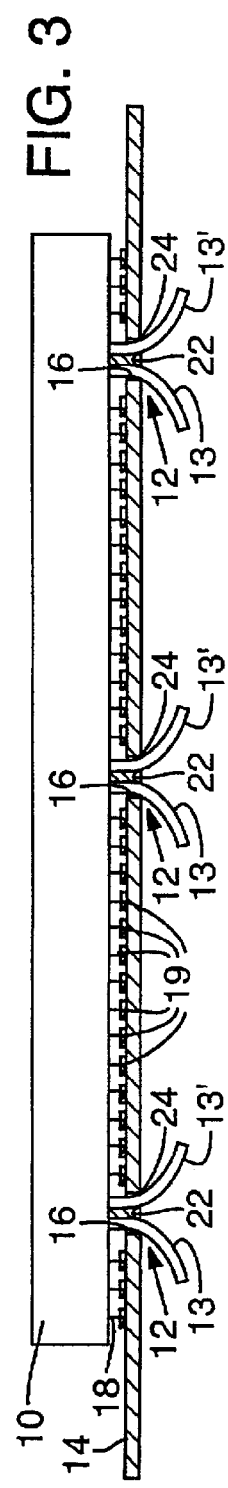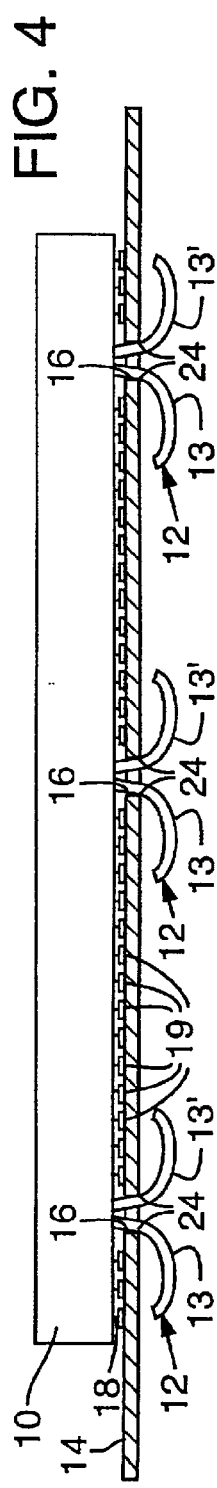

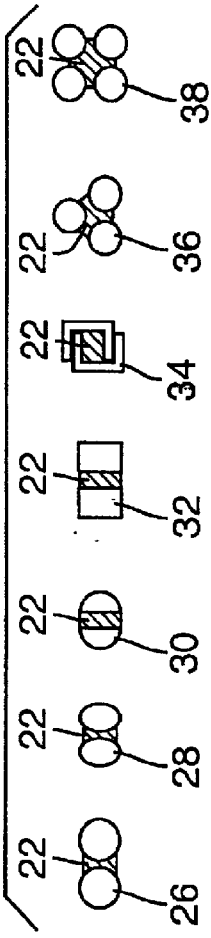
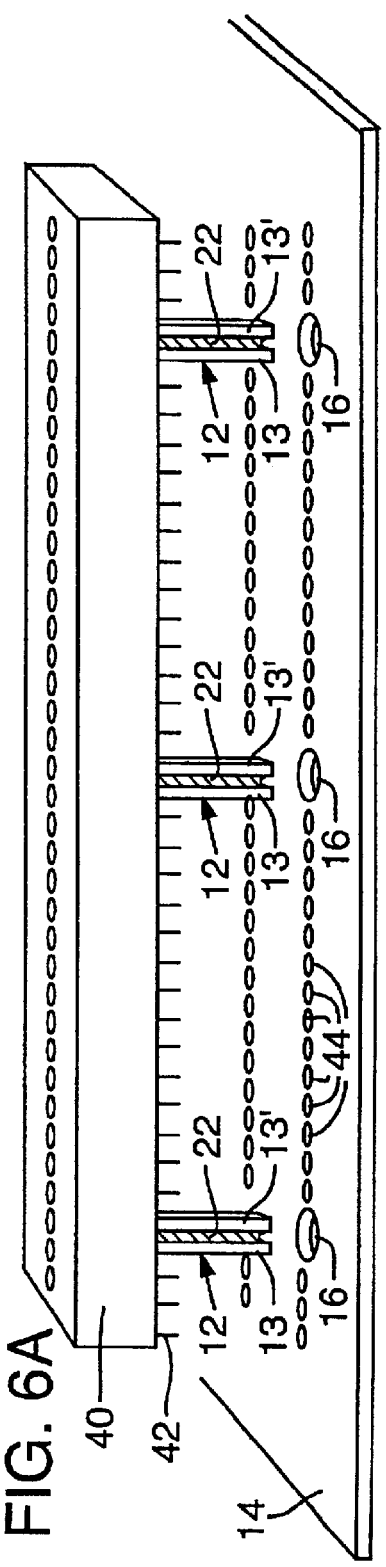
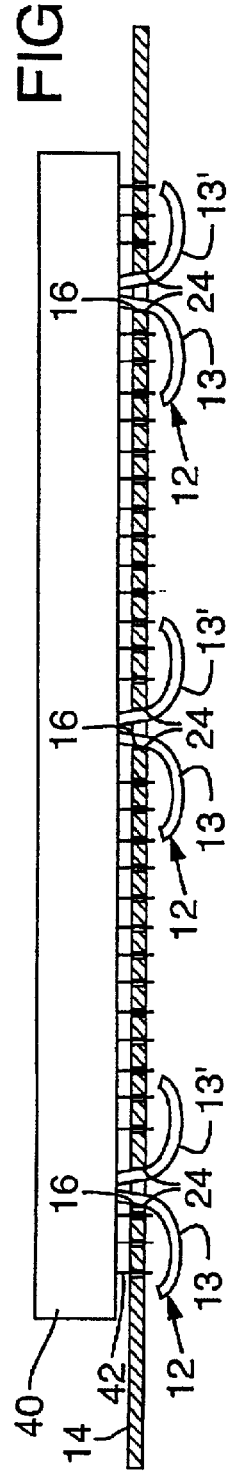

ZERO INSERTION FORCE HEAT-ACTIVATED RETENTION PIN

FIELD OF THE INVENTION

The present invention pertains to an apparatus and method for securing components to carrier substrates. In particular, the present invention relates to a zero insertion force heat-activated retention pin that ensures a good electrical connection between the component and the carrier substrate, and minimizes the potential for open electronic connections.

BACKGROUND OF INVENTION

Decreasing packaged circuit board size, decreasing packaging costs, and increasing component packaging density are ongoing goals of the computer industry, and specifically the substrate packaging industry. Accordingly, various components are typically connected to the carrier substrate, for example printed circuit boards, through an electronic connection made by a conductive material, such as solder. Some components connect directly to the carrier substrate, such as capacitors, resistors, CPUs and the like. Other components detachably connect to the carrier substrate through various connectors, which are connected to the carrier substrate. Connectors come in a variety of sizes and mount to carrier substrates to enable various memory modules and input output devices to electrically connect to the carrier substrate. Example connectors include Dual In-line Memory Module Sockets ("DIMM Sockets") and card edge connectors for secondary boards.

The effectiveness of the components that connect to the carrier substrate depends largely on the integrity of the electrical connection between the carrier substrate and the particular connector or component. Two primary techniques to attach components to carrier substrates are Through hole mount technology ("THM"), and surface mount technology ("SMT").

THM has been the standard way of attaching components, especially connectors, to carrier substrates for over forty years. In THM components, the component leads consist of individual pins that engage a corresponding electrical interface pattern, which are holes in the carrier substrate (see FIG. 6A for an example of a THM connector) that form a hole pattern. THM technology, however, limits the density that components can be placed on a carrier substrate because the holes penetrate all layers of the carrier substrate, which in turn restricts or blocks routing channels on every layer.

SMT is a newer technology, but has been used for over fifteen years. SMT differs from THM in that the electrical interface pattern on the carrier substrate are not holes, but rather consists of pads that reside on the surface of the carrier substrate. The component, then, sits on top of the carrier substrate with its component leads in contact with or close proximity to the carrier substrate electrical interface pattern. This maximizes the available routing space on the carrier substrate and allows denser packing of components.

Currently, both THM and SMT components are typically fixed to the board through a soldering process. THM components typically go through a wave soldering process, which is well known to those skilled in the art. Briefly, in a wave soldering process, THM components are placed on the carrier substrate, the carrier substrate enters the wave solder machine, encounters a preheat region, and is passed over the top of a molten solder wave. When the solder wave contacts the portion of the component leads protruding through the electrical interface pattern holes, the solder is drawn up into the hole and the component lead via capillary action. As the board moves beyond the solder wave, the temperature is reduced and the solder solidifies, securing the connection between the component lead and the electrical interface pattern hole in the carrier substrate.

SMT components are typically connected to the carrier substrate through a solder reflow process. The solder reflow process is also well known in the art of carrier substrate packaging. A conductive material is placed on the carrier substrate at designated spots to which the leads of the component are to attach. The component is placed onto the carrier substrate with conductive material (e.g. solder) residing between the component leads and the electrical interface pattern of the carrier substrate. The carrier substrate then passes through a reflow oven where it encounters a profile of gradually rising temperature, reaching a peak temperature above the solder reflow temperature where the conductive material melts and makes the electrical connection. The process is concluded with a cool down period where the conductive material solidifies. The solder reflow process is more desirable than the wave solder process in that it is generally more efficient, environmentally friendly, and cost effective.

A problem exists, however, with both the wave solder process and the solder reflow process. As the board passes through the higher temperatures, the carrier substrate tends to sag. When dealing with longer components, for example card edge connectors and DIMM sockets, the sag of the substrate creates a space between the connector and substrate, resulting in potentially open connections (see FIG. 7A).

In order to prevent carrier substrate sag in both the solder reflow and the wave soldering processes, state of the art components include retention pins that forcibly engage holes in the carrier substrate. These retention pins come in a variety of shapes and designs, including barbed or tapered as shown in FIGS. 7B and 7C, respectively. The state of the art retention pins require a certain amount of insertion force to cause the retention pin to snap (barbed tip) or wedge (tapered tip) into the carrier substrate hole such that it retains the carrier substrate in a coplanar relationship with the connector and prevents sag as the carrier substrate passes through a soldering process.

Though the state of the art retention pins may help prevent sag, they present other problems in the carrier substrate packaging process including the occupational safety concern of repetitive motion injuries for human placed components, most SMT placement machines are not designed to apply the necessary force to a component as it is placed on the board, and forcibly inserting components onto a carrier substrate increases the risk of damaging component leads.

It would thus be advantageous to develop a retention pin that can be used with either THM or SMT components that would require no force to insert the retention pin and yet would prevent board sag while the board passes through an increasing temperature profile, as encountered, for example, in the solder reflow or wave solder processes.

These and other variations as well as the invention itself will become more readily apparent upon reference to the following detailed description.

BRIEF DESCRIPTION OF DRAWINGS

The specification concludes with the claims, which particularly point out and distinctly claim that which is regarded as the present invention. The advantages of this invention can be more readily ascertained from the following detailed description when read in conjunction with the accompanying drawings:

FIG. 1 is a side view of an SMT connector with the zero insertion force heat activated retention pins prior to placement on the carrier substrate.

FIG. 2 is a side view of an SMT connector placed on the carrier substrate with the zero insertion force heat activated retention pins extending through the carrier substrate.

FIG. 3 is a side view of an SMT connector and a carrier substrate depicting the zero insertion force heat activated retention pins applying an upward force on the carrier substrate as the legs return to their natural curved state.

FIG. 4 is a side view of an SMT connector fully seated on the carrier substrate and the zero insertion force heat activated retention pins in a curved state.

FIG. 5 illustrates various end view examples and configurations of zero insertion force heat activated retention pins.

FIG. 6A is a side view of a THM connector prior to insertion onto a carrier substrate with zero insertion force heat activated retention pins secured in a substantially straight position.

FIG. 6B is a side view of a THM connector placed on a carrier substrate with the zero insertion force heat activated retention pins expanded to a curved state after passing through the wave solder process.

DETAILED DESCRIPTION

Figure 7A:
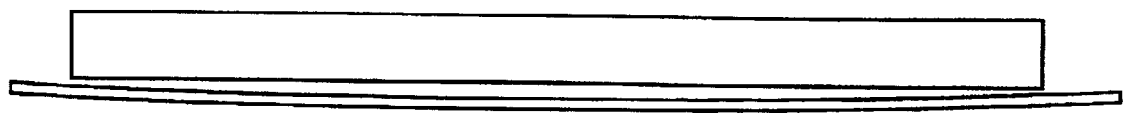
FIG. 7A is a side view of a state of the art SMT connector placed on a carrier substrate without retention pins.
Figure 7B:
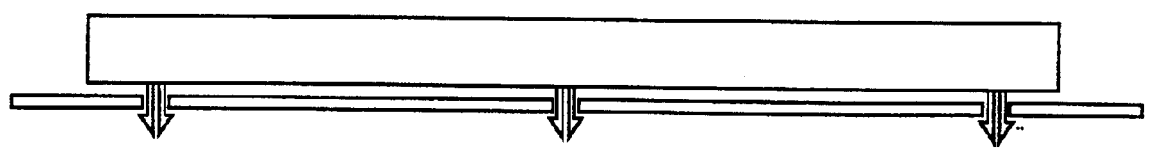
FIG. 7B is a side view of a component connected to a carrier substrate with state of the art retention pins that are barbed.
Figure 7C:
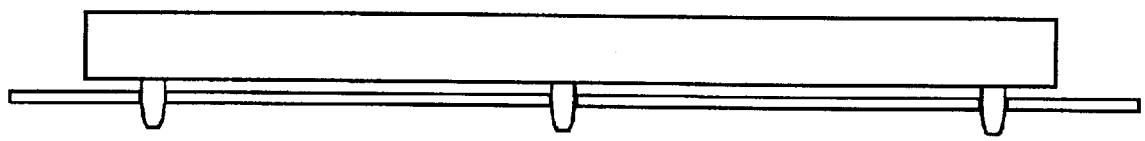
FIG. 7C is a side view of a component connected to a carrier substrate with state of the art retention pins that are tapered.

Although the figures illustrate various views of the illustrated embodiment, these figures are not meant to portray carrier substrates, SMT connectors or THM connectors in precise detail. Rather, these figures illustrate the interface between a carrier substrate and a component, such as a connector, in a manner to more clearly convey the concepts of the illustrated embodiment. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents. Furthermore, elements common between the figures retain the same numeric distinction.

FIGS. 1 through 4 illustrate the preferred embodiment of the present invention. Generally, SMT connector 10, having leads 18, is placed on a carrier substrate 14, such that leads 18 contact or are in close proximity to electrical interface pattern 20. Carrier substrate 14 can include printed circuit boards, interposers, motherboards, and the like. In the disclosed embodiment, the carrier substrate is a printed circuit board. The electrical connection between leads 18 and electrical interface pattern 20 is secured via conductive material 19. Conductive material 19 can include materials such as solder, both leaded and lead-free, conductive adhesives, and the like. In the reflow process, conductive material 19 is heated to a point at or above its melting temperature and then cooled. Retention pins 12, extending from connector 10, engage holes 16 in carrier substrate 14 when connector 10 is placed on carrier substrate 14. Retention pins 12 expand upon heating and provide an upward force on rim 24 of hole 16 to counter the sag encountered when carrier substrate 14 is heated in the reflow process. This action maintains the carrier substrate 14 in a coplanar relationship to connector 10, which in turn minimizes the potential for open electronic connections.

Specifically, FIG. 1 depicts an SMT connector 10 prior to placement on carrier substrate 14. Retention pins 12 of the preferred embodiment extend outward from the bottom side of connector 10. In the illustrated embodiment, retention pin 12 is made up of two legs, 13 and 13'. The legs could also be two prongs cut out of a single piece of material. In their natural state, the legs 13 and 13' bend outward, as shown in FIG. 4. As seen in FIG. 1, however, the legs 13 and 13' are spring loaded or retained in a substantially straight and parallel state by securing material 22. When retained in the generally straight and parallel position, retention pins 12 are smaller in diameter than holes 16 in carrier substrate 14. Being smaller in diameter and generally straight allows connector 10 to be readily placed onto carrier substrate 14 without applying any force.

In the illustrated embodiment, a conductive material 19 is selectively applied to the electrical interface pattern 20 of carrier substrate 14 to bridge the connection and any gaps between the leads 18 and electrical interface pattern 20 when connector 10 is seated on the carrier substrate 14. When heated to its melting point, as in the reflow process and subsequently cooled, conductive material 19 secures leads 18 to the electrical interface pattern 20. In the illustrated embodiment, a eutectic solder is used for conductive material 19, which is composed of 63% tin and 37% lead and has as reflow temperature of 183 degrees Celsius. A number of materials can be used for conductive material 19, including lead and lead-free solders, conductive adhesives and the like.

Prior to reaching the melting point of conductive material 19, the carrier substrate and component assembly encounter an increasing temperature profile. Accordingly, as the assembly proceeds through the reflow process, securing material 22, having a melting point lower than the melting point of the conductive material 19, melts, gradually releasing the bond between legs 13 and 13' of retention pin 12. As the bond is released, legs 13 and 13' tend to recoil toward their natural curved state.

In the illustrated embodiment, the securing material 22 is a low temperature solder, 43% tin 57% bismuth with a melting point of 139 degrees Celsius, which is below the melting point of conductive material 19 that secures leads 18 of connector 10 to the electrical interface pattern 20 of carrier substrate 14. One skilled in the art would recognize, however, that any material could be used, such as heat releasable adhesives or tape. Three parameters drive the type of securing material 22 used to secure legs 13 and 13' in a substantially straight position to allow insertion without force. First, the securing material 22 must be compatible with the material out of which legs 13 and 13' are constructed. Second, securing material 22 must be able to withstand the spring forces applied by legs 13 and 13', keeping the legs restrained in the substantially straight position until securing material 22 is heat released. Third, securing material 22 must have a melting point lower than the melting point of conductive material 19 used to solidify the connection between leads 18 of connector 10 to the electrical interface pattern 20 of carrier substrate 14.

FIG. 2 depicts the SMT connector 10 placed on carrier substrate 14, where leads 18 are poised for connection with electrical interface pattern 20 through conductive material 19, and retention pins 12 extend through holes 16. Legs 13 and 13' of retention pin 12 are retained in a substantially straight position. It is in this configuration that the assembly of carrier substrate 14 and connector 10 is ready to pass through the reflow process.

As discussed above, the reflow process as discussed in this embodiment is well known in the art and is typically used for SMT components, however any form of exposure to an increasing temperature profile would suffice. During the reflow process, the assembly of carrier substrate 14 and connector 10 encounter an increasing heat profile as the assembly passes through the reflow oven. The maximum temperature encountered is one above the melting point of conductive material 19. After exposure to the reflow temperature for a period of time, the assembly of carrier substrate 14 and the connector 10 go through a cool down stage where the conductive material 19 solidifies, securing the electrical connection between the leads 18 and the carrier substrate electrical interface pattern 20.

FIG. 3 shows the assembly of carrier substrate 14 and the SMT connector 10 in the early stages of the heating process. As illustrated, as the temperature gradient begins to rise above securing material 22's melting point, the securing material 22 that retains legs 13 and 13' in the substantially straight position begins to melt. Accordingly, legs 13 and 13' gradually begin to spring apart toward their natural curved state. In recoiling to their natural state, the edges of legs 13 and 13' contact rim 24 of holes 16. The continuing and gradually increasing force applied by legs 13 and 13' on rim 24 as they recoil toward their natural state, keeps the carrier substrate 14 and the SMT connector 10 coplanar and prevents carrier substrate 14 from sagging as the temperature reaches the solder reflow temperature. Without the sagging, the solder in conductive material 19 can thoroughly bridge between the leads 18 and carrier substrate electrical interface pattern 20, which allows a secure connection upon cooling without leaving open electrical connections.

FIG. 4 shows the assembly of carrier substrate 14 and SMT connector 10 after cooling. Legs 13 and 13' of retention pins 12 are in the curved position with leads 18 securely electronically connected to electrical interface pattern 20, with no open contacts typically caused by carrier substrate sag. The ends of sprung legs 13 and 13' can, but do not need to touch the bottom of carrier substrate. The upward force applied at the rim 24 of hole 16 is generally sufficient to maintain coplanarity of the carrier substrate 14 and SMT connector 10. Once cooled, the supporting force is no longer required, as the solidified conductive material 19 keeps the connection secure.

As shown in FIGS. 1 through 4, legs 13 and 13' of retention pin 12 are generally rectangular in shape. As illustrated in FIG. 5, one skilled in the art would recognize that legs 13 and 13' of retention pins 12 can come in a variety of cross sections, including, but not limited to round 26, oval 28, half-round 30, square 32, and interlocking 34. One skilled in the art would also appreciate that the retention pins 12 of the present invention could be made out of numerous materials, including heat treated metal, metal alloys, high temperature plastics or other resilient materials that can be constrained in a substantially straight position, but will spring back toward its natural shape upon removal of the constraint.

Moreover, the example illustrated in drawings 1 through 4 of the preferred embodiment consist of two legs per retention pin. One skilled in the art would appreciate that the number of legs used to make up a retention pin 12 of the present invention could include more than two legs. (see three-leg 36 and four-leg 38 examples in FIG. 5).

Another embodiment of the retention pins of the present invention, but not depicted in the Figures, includes the use of memory materials for legs 13 and 13'. Memory materials have a certain shape at one temperature and when heated to or past a transition temperature, the memory material recovers a memorized shape. At a lower temperature, then, the memory material legs would have a substantially straight shape, so as to allow the SMT component to be placed on the carrier substrate without applying additional force to get the retention pins to penetrate the holes in the carrier substrate. At a selected transition temperature that is below the melting point of the conductive material 19, the memory material can recover its curved memorized shape, which would supply the upward force necessary to counteract the tendency of the carrier substrate to sag.

Memory materials can be made out of metal alloys, such as nickel titanium, or certain polymers and plastics. Use of memory materials eliminates the need for securing material 22 to hold the legs in a substantially straight position. Accordingly, a retention pin could be made up of multiple legs, as with the retention pins discussed in regards to the illustrated embodiment. Since securing material 22 is not required for memory materials, the retention pin could also consist of only a single memory material leg, that when the transition temperature is reached, the single leg recovers to its memorized curved state effectuating the same upward force on the carrier substrate, thus preventing sag.

The zero insertion force heat activated retention pin described in the above embodiments with respect to the SMT components and connectors can also be used with THM components and connectors to prevent board sag and reduce the potential for open electronic connections as the carrier substrate and components pass through the reflow process.

FIG. 6A illustrates a THM connector 40 with leads 42 and retention pins 12 extending therefrom, ready for placement on the carrier substrate 14. Carrier substrate 14 has carrier substrate retention pin accommodating holes 16 and carrier substrate electrical interface pattern 44, which are holes that extend from the top layer to the bottom layer of the carrier substrate 14. The zero insertion force heat activated retention pins 12 used for the THM connector 40 have the same attributes as that those described for the SMT connector 10 above.

As described in the Background of the Invention section, the electronic connection between the THM leads 42 and the carrier substrate electrical interface pattern 44 is typically completed in a wave solder process. As with the SMT components and the reflow process, carrier substrate 14 still encounters an increasing temperature profile to the point the carrier substrate 14 passes over the solder wave. The maximum temperatures reached in the wave solder process still give rise to the problem of carrier substrate sag. Board sag can result in open electrical connections, but in THM components, sag also gives rise to problems such as component tilt, where the component is tilted from one side to the other. Tilt creates aesthetic as well as functional problems. Another problem encountered as a result of sag in THM components is lead-not-through, which indicates that the lead may not protrude through the hole. This means that lead 42 only partially engages the holes of electrical interface pattern 44, or else lead 42 is bent over or did not engage the holes of electrical interface pattern 44 at all.

Zero insertion force heat activated retention pins of the present invention can prevent the problems associated with carrier substrate sag in THM components. FIG. 6B illustrates the THM connector 40 attached to carrier substrate 14 after undergoing a wave soldering process. Securing material 22 has gradually melted away as the temperatures experienced by the assembly of carrier substrate 14 and connector 40 increased to the melting point of the molten solder wave. The retention pins 12 have sprung back to a curved position, keeping the carrier substrate 14 from sagging and generally maintaining the coplanar relationship between the carrier substrate 14 and the THM connector 40.

Not illustrated in the figures, THM components can also be secured to a carrier substrate board in a reflow process. In this situation, the conductive material 19 used in the SMT components (19 in FIGS. 1–4) is selectively placed over the electrical interface pattern holes 44 of carrier substrate 14. When the THM connector 40 is placed on the carrier substrate 14 and passed through the reflow process, the conductive material melts and secures the THM connector pins to the carrier substrate electrical interface pattern 44. Again, to prevent board sag, the zero insertion force heat activated retention pins 12, as described above, maintain the carrier substrate 14 in a coplanar relationship with the THM connector 40 and reduce board sag and its undesirable effects.

As with the SMT components, the preferred embodiment of the zero insertion force retention pins 12 described for use with THM components are spring loaded materials that are restrained in a substantially straight and unnatural position by securing material 22. However, memory materials, as described above, can also be used as the legs of the retention pin, where the shape of the material is not bound by securing material 22, but rather is straight at lower temperatures and takes on a curved shape at a transition temperature, which is below the maximum temperatures encountered in the heat profile encountered in process such as the wave solder or reflow process.

Having described in detail the embodiments of the present invention, it is understood that the invention defined by the claims is not to be limited by particular details set forth in the above description, as many apparent variations and a wide variety of alternate and/or equivalent implementations calculated to achieve the same purposes thereof would be appreciated by one skilled in the art without departing from the spirit or scope of the invention. This application is intended to cover any adaptations or variations of the embodiments discussed herein, and it is therefore manifestly intended that the invention be limited only by the claims and the equivalents thereof.

What is claimed is:

1. A pin for connecting components to a carrier substrate comprising:
   at least one leg having a first end and a second end, the at least one leg having a substantially straight first position at a first temperature and a curved second position at a second temperature, the second temperature being greater than the first temperature, the first end of the at least one leg being coupled to a component, the second end of the at least one leg in the substantially straight first position being adapted for insertion into an accommodating aperture in the carrier substrate, the second end of the at least one leg being convertible from the substantially straight first position to the curved second position through exposure to the second temperature, the second end in the curved second position urging the carrier substrate toward the component.

2. The pin of claim 1 further comprising:
   a plurality of legs including the at least one leg;
   a securing material restraining the plurality of legs in the substantially straight first position at the first temperature; the securing material responsive to the second temperature to release the plurality of legs at the second temperature.

3. The pin of claim 2 wherein the at least one leg is made of metal.

4. The pin of claim 2 wherein the at least one leg is made of high temperature plastic.

5. The pin of claim 2 wherein the restraining material is a low temperature solder.

6. The pin of claim 2 wherein the restraining material is a heat releasable adhesive.

7. The pin of claim 1 wherein the at least one leg is a memory material, the memory material responsive to the second temperature to produce the curved second position.

8. The pin of claim 7, wherein the memory material is a metal alloy.

9. The pin of claim 7, wherein the memory material is a polymer.

10. An assembly of a component and a carrier substrate comprising:
    a carrier substrate having a first side and a second side, the carrier substrate having at least one aperture having a predetermined size that extends from the first side to the second side of the carrier substrate;
    at least one component;
    at least one elongated pin extending from the component, the at least one pin to be in a complementary relationship with the at least one aperture of the carrier substrate, the at least one pin having a substantially straight first position adapted to pass through the at least one aperture, and responsive to heat application a curved second position wherein the pin expands beyond the aperture size temporarily providing support for the carrier substrate.

11. The assembly of claim 10, wherein:
    the component having a plurality of leads;
    the carrier substrate having a plurality of contact points in a complementary relationship to the leads;
    a temperature sensitive conductive material adapted to electrically couple the leads to the contact points, the conductive material having a predetermined melting temperature;
    the pin achieving the curved second position by exposure to a temperature below the predetermined melting temperature of the conductive material.

12. The assembly of claim 11, wherein:
    the pin further comprises a plurality of legs, each leg having a substantially straight first position and a curved second position, the plurality of legs being restrained under spring tension in the substantially straight first position;
    a securing material adapted to restrain the plurality of legs in the substantially straight first position below a predetermined first temperature, the securing material adapted to release the plurality of legs above a predetermined second temperature, the predetermined second temperature being less than the predetermined melting temperature of the conductive material.

13. The pin of claim 12, wherein the plurality of legs are made of metal.

14. The pin of claim 12, wherein the plurality of legs are made of a high temperature plastic.

15. The pin of claim 12, wherein the securing material is a low temperature solder.

16. The pin of claim 12, wherein the securing material is a heat releasable adhesive.

17. The assembly of claim 11 wherein the pin further comprises at least one leg, the at least one leg is a memory material having a substantially straight first position at, a first temperature and a curved second position at a second temperature, the second temperature being greater than the first temperature, and the second temperature being less than the predetermined melting temperature of the conductive material.

18. The assembly of claim 17, wherein the memory material is a metal alloy.

19. The assembly of claim 17, wherein the memory material is a polymer.

20. The assembly of claim 10, wherein the component is a connector that allows components to be removably connected to the carrier substrate.

21. The assembly of claim 10, wherein the component is a surface mount component.

22. The assembly of claim 10, wherein the component is a through hole mount component.

23. A method of connecting a component to a carrier substrate comprising:

providing a component with at least one pin extending therefrom, the at least one pin being in a substantially straight position;

providing a carrier substrate with at least one aperture sized therein to accommodate the at least one pin;

aligning the at least one pins over the at least one aperture;

inserting the at least one pin into the at least one aperture such that they protrude through the at least one aperture;

exposing the at least one pin to a predetermined temperature such that the at least one retention pin bends to urge the carrier substrate toward the component.

24. The method of claim 23, wherein exposing the at least one pin to a predetermined temperature includes passing the carrier substrate, component and at least one pin through a solder reflow process.

25. The method of claim 23, wherein exposing the at least one pin to a predetermined temperature includes passing the carrier substrate, component and at least one pin through a wave solder process.

26. A method of manufacturing a pin for connecting components to carrier substrates comprising:

providing a plurality of individual legs having a curved resting state; the legs having a first end and a second end;

coupling the plurality of individual legs at the first end;

clamping the second end of the plurality of legs to a substantially straight and parallel position;

restraining the legs in a substantially straight and parallel position.

27. The method of claim 26, wherein restraining the plurality of legs in a substantially straight and parallel position includes disposing a low temperature solder between the plurality of legs.

28. The method of claim 26, wherein restraining the plurality of legs in a substantially straight and parallel position includes disposing a heat releasable adhesive between the plurality of legs.

29. The method of claim 26, further comprising securing the first end of the retention pins to a component that is to be placed on a carrier substrate.

* * * * *

UNITED STATES PATENT AND TRADEMARK OFFICE
CERTIFICATE OF CORRECTION

PATENT NO.   : 6,764,325 B2
DATED        : June 20, 2004
INVENTOR(S)  : Arrigotti et al.

It is certified that error appears in the above-identified patent and that said Letters Patent is hereby corrected as shown below:

Column 9,
Line 5, "...at, a..." should read -- ...at a... --; and
Line 29, "...one pins..." should read -- ...one pin... --.

Signed and Sealed this

Twenty-fourth Day of January, 2006

JON W. DUDAS
*Director of the United States Patent and Trademark Office*